(12) United States Patent
Kim et al.

(10) Patent No.: US 12,701,657 B2
(45) Date of Patent: Aug. 4, 2026

(54) ELECTRICAL COMPONENT AND METHOD OF FORMING SAME

(71) Applicant: Medtronic, Inc., Minneapolis, MN (US)

(72) Inventors: Chunho Kim, Phoenix, AZ (US); Mark E. Henschel, Phoenix, AZ (US); Songhua Shi, Tempe, AZ (US)

(73) Assignee: Medtronic, Inc., Minneapolis, MN (US)

( * ) Notice: Subject to any disclaimer, the term of this patent is extended or adjusted under 35 U.S.C. 154(b) by 1455 days.

(21) Appl. No.: 16/678,479

(22) Filed: Nov. 8, 2019

(65) Prior Publication Data

US 2020/0154567 A1 May 14, 2020

Related U.S. Application Data

(60) Provisional application No. 62/760,224, filed on Nov. 13, 2018.

(51) Int. Cl.
| | |
|---|---|
| *H05K 1/11* | (2006.01) |
| *H05K 1/03* | (2006.01) |
| *H05K 3/12* | (2006.01) |

(52) U.S. Cl.
CPC ........... *H05K 1/115* (2013.01); *H05K 1/0306* (2013.01); *H05K 3/1258* (2013.01); *H05K 2201/0959* (2013.01); *H05K 2201/10909* (2013.01); *H05K 2203/1131* (2013.01)

(58) Field of Classification Search
CPC .......... H01G 9/012; H01G 9/052; H01G 9/08; H01G 9/15; H05K 1/0306; H05K 1/162; H05K 2201/0224; H05K 3/1291
See application file for complete search history.

(56) References Cited

U.S. PATENT DOCUMENTS

| | | |
|---|---|---|
| 6,510,044 B1 | 1/2003 | Loffelholz et al. |
| 8,992,635 B2 | 3/2015 | Otterstedt |

(Continued)

FOREIGN PATENT DOCUMENTS

| | | |
|---|---|---|
| JP | 2001307956 A | 11/2001 |
| TW | 578176 B | 3/2004 |

OTHER PUBLICATIONS (PCT/US2019/060919) PCT Notification of Transmittal of the International Search Report and the Written Opinion of the International Searching Authority, Mailed Mar. 12, 2020, 14 pages.

*Primary Examiner* — Timothy J Thompson
*Assistant Examiner* — Rhadames Alonzo Miller
(74) *Attorney, Agent, or Firm* — Mueting Raasch Group

(57) ABSTRACT

Various embodiments of an electrical component and a method of forming such component are disclosed. The electrical component includes a substrate having a first major surface, a second major surface, and an opening disposed in the substrate. The opening extends between the first major surface and the second major surface. Tantalum material is disposed within the opening. Further, the tantalum material includes tantalum particles. The electrical component also includes an anode electrode disposed on the first major surface of the substrate and over the opening and a cathode electrode disposed on the second major surface of the substrate and over the opening.

20 Claims, 4 Drawing Sheets

(56)     References Cited

U.S. PATENT DOCUMENTS

| | | | |
|---|---|---|---|
| 2005/0280978 A1* | 12/2005 | Sakaguchi | H01G 9/15 |
| | | | 361/523 |
| 2006/0143887 A1* | 7/2006 | Srinivasan | H01G 4/10 |
| | | | 29/842 |
| 2007/0279840 A1 | 12/2007 | Jin et al. | |
| 2010/0302713 A1* | 12/2010 | Zednicek | H01G 9/052 |
| | | | 361/529 |
| 2012/0300369 A1 | 11/2012 | Lee et al. | |
| 2017/0172505 A1* | 6/2017 | Ruben | H05K 3/0017 |

* cited by examiner

ELECTRICAL COMPONENT AND METHOD OF FORMING SAME

This application claims the benefit of U.S. Provisional Application No. 62/760,224, filed Nov. 13, 2018, the disclosure of which is incorporated by reference herein in its entirety.

TECHNICAL FIELD

This disclosure generally relates to electrical components suitable for use in implantable devices.

BACKGROUND

A wide variety of electronic assemblies such as those that are utilized for implantable medical devices (IMDs) employ electronic circuitry, e.g., for providing electrical stimulation of body tissue and/or monitoring a physiologic condition. Such IMDs can deliver electrical therapy energy in the form of shocking energy and stimulating pulses to selected body tissue and typically include output circuitry for generating the electrical energy under prescribed conditions and at least one lead bearing a stimulation electrode for delivering the electrical energy to the selected tissue. For example, cardiac pacemakers and implantable cardioverter-defibrillators (ICDs) have been developed for maintaining a desired heart rate during episodes of bradycardia or for applying cardioversion or defibrillation therapies to the heart upon detection of serious arrhythmias. Other nerve, brain, muscle, and organ tissue stimulating medical devices are also known for treating a variety of conditions.

Currently available IMDs, including ICDs and implantable pulse generators (IPGs), are typically formed having a metallic housing that is hermetically sealed and, therefore, is impervious to body fluids, and a header or connector assembly mounted to the housing for making electrical and mechanical connection with one or more leads. Such devices also possess telemetry capabilities for communicating with external devices. Over the past 20 years, IMDs have evolved from relatively bulky devices to complex miniaturized devices that exhibit increasing functionality. For example, numerous improvements have been made in cardioversion/defibrillation leads and electrodes that have enabled cardioversion/defibrillation energy to be precisely delivered to selected one or more portions of upper and lower heart chambers, thereby dramatically reducing the delivered shock energy required to cardiovert or defibrillate the heart chamber. The high voltage output circuitry has also been improved in many respects to provide monophasic, biphasic, or multi-phase cardioversion/defibrillation shock or pulse waveforms that are efficacious, sometimes with particular combinations of cardioversion/defibrillation electrodes, in lowering the required shock energy to cardiovert or defibrillate the heart.

The miniaturization of IMDs is driving size and cost reduction of all IMD components, including the electronic circuitry components, where it is desirable to increase the density and reduce the size of such components so that the overall circuitry can be more compact. As the dimensions of IMDs decrease, the electronic circuits of the IMD are formed as integrated circuits to fit within a minimal space. Furthermore, as the dimensions of the components are also being reduced, it is desirable to improve the use of the available space within the IMD package.

Electronic circuitry for IMDs and other electronic devices can include one or more capacitors. Such capacitors are passive components that store potential energy in an electric field and are designed to add capacitance to circuits. Various types of capacitors can be utilized, including ceramic and electrolytic capacitors. Tantalum capacitors are a type of electrolytic capacitor that have a relatively high capacitive density compared to other capacitors such as ceramic capacitors.

SUMMARY

The techniques of this disclosure generally relate to electrical components and methods for forming such electrical components. In one or more embodiments, an electrical component can include tantalum material disposed within an opening of a substrate, an anode electrode disposed over the opening on a first major surface of the substrate, and a cathode electrode disposed over the opening on a second major surface of the substrate. The tantalum material can include tantalum particles. In one or more embodiments, the electrical component can form a capacitor that can be utilized in any suitable electronic circuit or device.

In one example, aspects of this disclosure relate to an electrical component that includes a substrate having a first major surface, a second major surface, and an opening disposed in the substrate. The opening extends between the first major surface and the second major surface. The electrical component also includes tantalum material disposed within the opening. The tantalum material includes tantalum particles. The electrical component also includes an anode electrode disposed on the first major surface of the substrate and over the opening and a cathode electrode disposed on the second major surface of the substrate and over the opening.

In another example, aspects of this disclosure relate to a method that includes disposing an opening in a substrate such that it extends between a first major surface and a second major surface of the substrate; disposing tantalum material into the opening of the substrate; disposing an anode electrode on the first major surface of the substrate and over the opening; and disposing a cathode electrode on the second major surface of the substrate and over the opening.

All headings provided herein are for the convenience of the reader and should not be used to limit the meaning of any text that follows the heading, unless so specified.

The terms "comprises" and variations thereof do not have a limiting meaning where these terms appear in the description and claims. Such terms will be understood to imply the inclusion of a stated step or element or group of steps or elements but not the exclusion of any other step or element or group of steps or elements.

In this application, terms such as "a," "an," and "the" are not intended to refer to only a singular entity but include the general class of which a specific example may be used for illustration. The terms "a," "an," and "the" are used interchangeably with the term "at least one." The phrases "at least one of" and "comprises at least one of" followed by a list refers to any one of the items in the list and any combination of two or more items in the list.

The phrases "at least one of" and "comprises at least one of" followed by a list refers to any one of the items in the list and any combination of two or more items in the list.

As used herein, the term "or" is generally employed in its usual sense including "and/or" unless the content clearly dictates otherwise.

The term "and/or" means one or all of the listed elements or a combination of any two or more of the listed elements.

As used herein in connection with a measured quantity, the term "about" refers to that variation in the measured quantity as would be expected by the skilled artisan making the measurement and exercising a level of care commensurate with the objective of the measurement and the precision of the measuring equipment used. Herein, "up to" a number (e.g., up to 50) includes the number (e.g., 50).

Also herein, the recitations of numerical ranges by endpoints include all numbers subsumed within that range as well as the endpoints (e.g., 1 to 5 includes 1, 1.5, 2, 2.75, 3, 3.80, 4, 5, etc.).

The details of one or more aspects of the disclosure are set forth in the accompanying drawings and the description below. Other features, objects, and advantages of the techniques described in this disclosure will be apparent from the description and drawings, and from the claims.

DETAILED DESCRIPTION

The techniques of this disclosure generally relate to electrical components and methods for forming such electrical components. In one or more embodiments, the electrical component can include tantalum material disposed within an opening of a substrate, an anode electrode disposed over the opening on a first major surface of the substrate, and a cathode electrode disposed over the opening on a second major surface of the substrate. The tantalum material can include tantalum particles. In one or more embodiments, the electrical component can form a capacitor that can be utilized in any suitable electronic circuit or device.

In general, the present disclosure provides various embodiments of apparatuses, systems, and associated techniques that relate to electrical components. Such electrical components can include any suitable components or circuitry, e.g., capacitors, tantalum capacitors, etc. Tantalum capacitors can be desirable for their reliability and capacitive density. Because of their dimensions, tantalum capacitors are typically disposed on surfaces of integrated circuit boards. At thicknesses greater than 1 mm, typical tantalum capacitors add significantly to the size and thickness of these integrated circuit boards. Further, such tantalum capacitors typically have volumetric efficiencies of less than 30%, where volumetric efficiency is defined as the volume of anode and cathode over the total capacitor package volume.

One or more embodiments of electrical components described herein can exhibit a volumetric efficiency of greater than 90% while having a thickness, e.g., of no greater than 100 μm. Because of this increased volumetric efficiency and decreased thickness, one or more electrical components described herein can be embedded within an integrated circuit board or integrated into a substrate, thereby enabling smaller electronic packages and assemblies.

Figure 1:
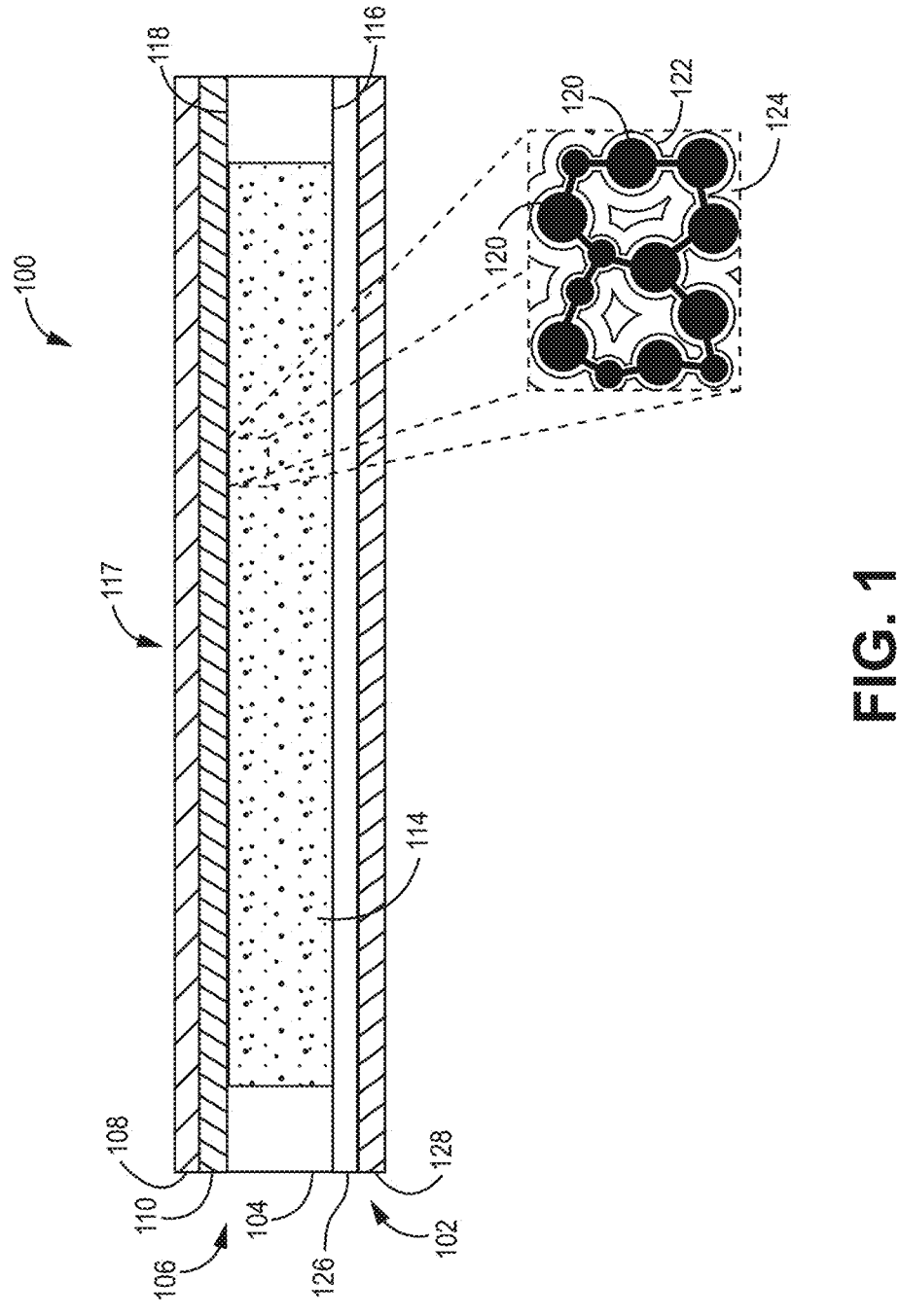
FIG. 1 is a schematic cross-section view of one embodiment of an electrical component.

FIG. 1 is a schematic cross-section view of one embodiment of an electrical component 100. Electrical component 100 includes a substrate 104 having a first major surface 116, a second major surface 118, and an opening 117 disposed in the substrate and extending between the first major surface 116 and the second major surface 118. The electrical component 100 also includes tantalum material 114 disposed within the opening 117, where the tantalum material includes tantalum particles 120. Further, the electrical component 100 includes an anode electrode 102 disposed on the first major surface 116 of the substrate 104 and over the opening 117, and a cathode electrode 106 disposed on the second major surface 118 of the substrate and over the opening.

The electrical component 100 can be utilized in any suitable device or electrical circuitry, e.g., printed circuit boards, integrated circuit packages, substrates, glass substrates, ceramic substrates, sapphire substrates, silicon substrates, etc. Further, the electrical component 100 can exhibit any suitable characteristics. For example, the electrical component 100 can include any suitable amount of tantalum by volume of the electrical component. In one or more embodiments, the electrical component 100 can have greater than 80% tantalum by volume of the electrical component. In one or more embodiments, the electrical component 100 can have greater than 90% tantalum by volume of the electrical component. Further, the electrical component 100 can have any suitable dimensions. In one or more embodiments, the electrical component 100 can have a height as measured in a direction orthogonal to the first and second major surfaces 116, 118 of the substrate 104 of no greater than 100 μm.

The substrate 104 can include any suitable dimensions and take any suitable shape. Further, the substrate 104 can include any suitable material or materials. In one or more embodiments, the substrate 104 includes at least one of sapphire, ceramic material, or other materials suitable to withstand sintering temperatures. In one or more embodiments, the substrate 104 may include graphene, silicon carbide, or other suitable materials. The substrate 104 can be a unitary substrate or include two or more portions that are joined together using any suitable technique or techniques.

Disposed in the substrate 104 and extending between the first and second major surfaces 116, 118 of the substrate is the opening 117. The opening 117 can include any suitable dimensions and take any suitable shape or shapes. Further, the opening 117 can be disposed in the substrate 104 using any suitable technique or techniques, e.g., wet etching, dry etching, mechanical etching, laser etching, etc. Although illustrated as including one opening 117, the electrical component 100 can include any suitable number of openings as is further described herein.

Disposed within the opening 117 is the tantalum material 114, which fills at least a portion of the opening. In one or more embodiments, the size and shape of the tantalum material 114 is determined by the size and shape of opening 117. Tantalum material 114 includes tantalum particles 120. Any suitable tantalum particles 120 can be utilized in the tantalum material 114. Further, the tantalum particles 120 can have any suitable dimensions.

The tantalum particles 120 can be electrically and mechanically coupled together using any suitable technique or techniques. In one or more embodiments, the tantalum particles 120 can be sintered together using any suitable technique or techniques, e.g., heating, laser, microwave, spark plasma, etc. Further, the tantalum material 114 can be disposed within the opening 117 using any suitable technique, e.g., deposition, printing, stencil printing, dispensing, jetting, etc. In one or more embodiments, the tantalum material 114 can include tantalum paste. Such tantalum paste can include binding agents to hold the tantalum particles 120 together. The tantalum paste can include any suitable binding agents, e.g., organic binders, solvents, etc.

The tantalum material 114 can further include a dielectric layer 122 disposed on a surface of one or more of the tantalum particles 120. In one or more embodiments, the dielectric layer 122 can be disposed on surfaces of substantially all of the tantalum particles 120. The dielectric layer 122 can include any suitable dielectric material or materials, e.g., tantalum pentoxide. Further, the dielectric layer 122 can be formed using any suitable technique or techniques, e.g., anodization.

Further, the tantalum material 114 can also include an electrolyte cathode layer 124 disposed on the dielectric layer 122. The electrolyte cathode layer 124 can include any suitable material or materials, e.g., manganese dioxide, conductive polymer, etc. Further, the electrolyte cathode layer 124 can include any suitable dimensions and take any suitable shape or shapes. And the electrolyte cathode 124 layer can be formed using any suitable technique or techniques, e.g., pyrolysis, press, laser sizing, printing.

The electrical component 100 can also include the anode electrode 102, which is disposed on the first major surface 116 of the substrate 104 and over the opening 117 of the substrate. Further, anode electrode 102 can include any suitable electrically conductive material or materials, e.g., copper, gold, silver, tantalum, graphite, aluminum, chrome, etc. The anode electrode 102 can include any suitable dimensions and take any suitable shape or shapes. Further, anode electrode 102 can be formed using any suitable technique or techniques, e.g., deposition, chemical vapor deposition (CVD), physical vapor deposition (PVD), sputtering, electroplating, printing, dispensing, etc. In one or more embodiments, the anode electrode 102 can be sintered to one or more of the tantalum particles 120 of the tantalum material 114 using any suitable technique or techniques.

The anode electrode 102 can include one or more layers. In one or more embodiments, the anode electrode 102 can include a tantalum layer 126 disposed on the first major surface 116 of the substrate 104 and over the opening 117, and a conductor layer 128 disposed on the tantalum layer. The tantalum layer 126 can include any suitable dimensions and take any suitable shape or shapes. The tantalum layer 126 can be formed using any suitable technique or techniques, e.g., deposition, PVD, CVD, sputtering, electroplating, foil lamination, etc. In one or more embodiments, the tantalum layer 126 can be sintered to one or more of the tantalum particles 120 using any suitable technique or techniques. In some embodiments, tantalum layer 126 may include one or more materials including titanium, zirconium, hafnium, vanadium, niobium, or other valve metals.

The conductor layer 128 of the anode electrode 102 can be disposed on the tantalum layer 126. Further, the conductor layer 128 can include any suitable electrically conductive material or materials, e.g., the same electrically conductive materials described herein regarding the anode electrode 102. Conductor layer 128 can also include any suitable dimensions and take any suitable shape or shapes. Further, the conductor layer 128 can be formed using any suitable technique or techniques, e.g., the same technique or techniques described herein regarding the anode electrode 102.

Disposed on the second major surface 118 of the substrate 104 and over the opening 117 of the substrate 104 is the cathode electrode 106. The cathode electrode 106 can include any suitable dimensions and take any suitable shape or shapes. Further, the cathode electrode 106 can include any suitable electrically conductive material or materials, e.g., the same electrically conductive materials described herein regarding the anode electrode 102. The cathode electrode 106 can include one or more layers. And the cathode electrode 106 can be formed using any suitable technique, e.g., the same technique or techniques described herein regarding the anode electrode 102.

In one or more embodiments, the cathode electrode 106 can include a cathode connection layer 110 disposed on the second major surface 118 of the substrate 104 and over the opening 117. The cathode connection layer 110 can include any suitable electrically conductive material or materials, e.g., the same electrically conductive materials described herein regarding the anode electrode 102. Further, the cathode connection layer 110 can include any suitable dimensions and take any suitable shape or shapes. And the cathode connection layer 110 can be formed using any suitable technique or techniques, e.g., the same technique or techniques described herein regarding the anode electrode 102.

Disposed on the cathode connection layer 110 is the conductor layer 108. The conductor layer 108 can include any suitable electrically conductive material or materials, e.g., the same electrically conductive materials described herein regarding the anode electrode 102. Further, the conductor layer 108 can include any suitable dimensions and take any suitable shape. And the conductor layer 108 can be formed using any suitable technique or techniques, e.g., the same technique or techniques described herein regarding the anode electrode 102. In one or more embodiments, the conductor layer 108 can be patterned using any suitable technique or techniques to provide a patterned conductive layer.

Figure 2:
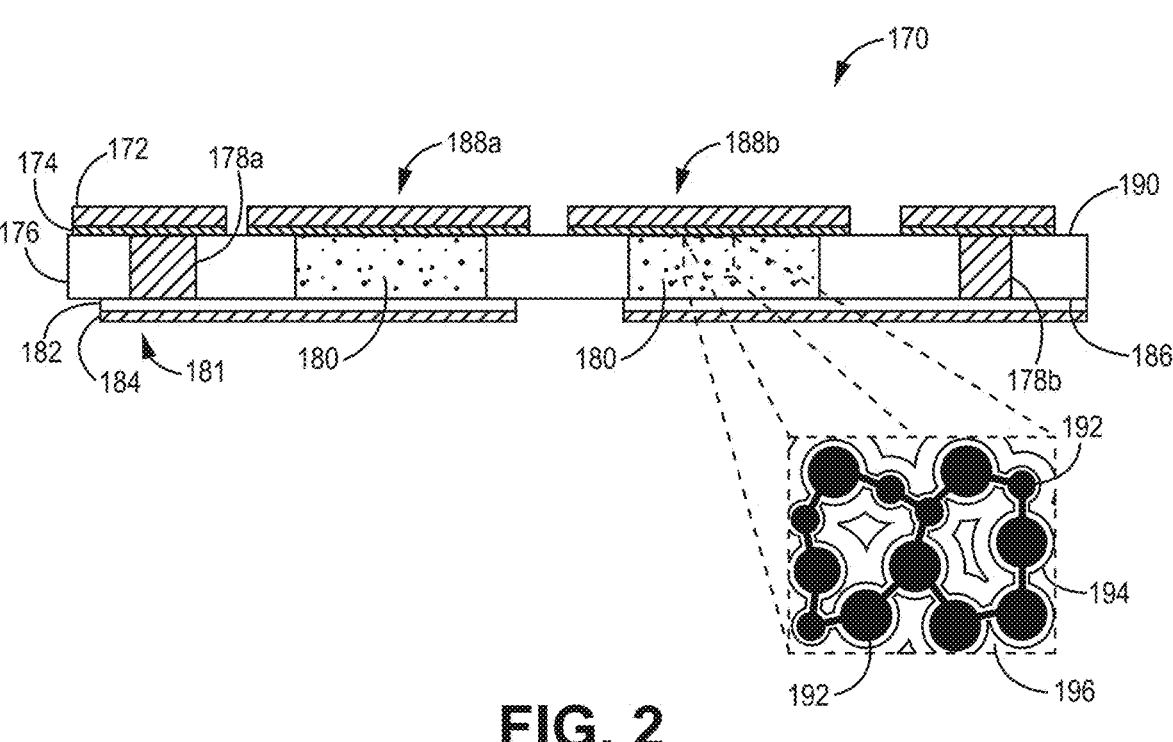
FIG. 2 is a schematic cross-section view of another embodiment of an electrical component.

The electrical component 100 can include any suitable number of openings disposed in the substrate 104. For example, FIG. 2 is a schematic cross-section view of another embodiment of an electrical component 170. All of the design considerations and possibilities regarding the electrical component 100 of FIG. 1 apply equally to the electrical component 170 of FIG. 2.

The electronic component 170 includes a substrate 176 that has a first major surface 186, a second major surface 190, a first opening 188a, and a second opening 188b (collectively referred to as openings 188). As used herein, the parts/features denoted with "a" and "b" suffixes are substantially identical to, or mirror images of, one another. It is understood that, unless otherwise noted, the description of an individual part/feature (e.g., part/feature identified with an "a" suffix) also applies to the opposing part/feature (e.g., part/feature identified with a "b" suffix). Similarly, the description of a part/feature identified with no suffix may apply, unless noted otherwise, to both the corresponding left and right part/feature.

Each of the openings 188 extends between the first major surface 186 and the second major surface 190. The electrical component 170 also includes tantalum material 180 disposed within each of the openings 188, where the tantalum material 180 includes tantalum particles 192. Further, the electrical component 170 also includes an anode electrode layer 181 disposed on the first major surface 186 of the substrate 176 and over each of the openings 188, and a cathode electrode layer 174 disposed on the second major surface 190 of the substrate 176 and over each of the openings.

The tantalum material 180 can further include a dielectric layer 194 disposed on a surface of one or more of the tantalum particles 192. In one or more embodiments, the dielectric layer 194 can be disposed on surfaces of substantially all of the tantalum particles 192. The dielectric layer 194 can include any suitable dielectric material or materials, e.g., tantalum pentoxide. Further, the dielectric layer 194 can be formed using any suitable technique or techniques, e.g., anodization.

Further, the tantalum material 190 can also include an electrolyte cathode layer 196 disposed on the dielectric layer 194. The electrolyte cathode layer 196 can include any suitable material or materials, e.g., manganese dioxide, conductive polymer, etc. Further, the electrolyte cathode layer 196 can include any suitable dimensions and take any suitable shape or shapes. And the electrolyte cathode layer 196 can be formed using any suitable technique or techniques, e.g., pyrolysis.

In the embodiment illustrated in FIG. 2, the anode electrode layer 181 can include a tantalum layer 182 and a conductor layer 184. The tantalum layer 182 is disposed on the first major surface 186 of the substrate and over openings 188. Further, the conductor layer 184 can be disposed on the tantalum layer 182.

One difference between electrical component 170 of FIG. 2 and electrical component 100 of FIG. 1 is that component 170 includes a first conductive via 178a and a second conductive via 178b (collectively conductive vias 178) disposed in the substrate 176. The electrical component 170 can include any suitable number of conductive vias 178. The conductive vias 178 can extend between the first and second major surfaces 186, 190 of the substrate 176. Further, the conductive vias 178 can have any suitable dimensions and take any suitable shape or shapes. The conductive vias 178 can include any suitable vias, e.g., plated through-hole vias, vertical interconnects, wires, etc.

In general, the conductive vias 178 allow for electrical connections between components, integrated circuit boards, printed wiring boards, and other electronics located on or adjacent the first and second major surfaces 186, 190 of the substrate 176 or within the substrate. In one or more embodiments, the conductive vias 178 allow the electrical component 170 to be used as an interposer. In one or more embodiments, the electronic component 170 can be an integrated tantalum capacitor substrate. Such integrated tantalum capacitor substrates can allow for high-capacitive density in an interposer.

The electronic component 170 can also include a patterned conductive layer 172 disposed on the cathode electrode layer 174. The patterned conductive layer 172 can include any suitable conductive material or materials, e.g., the same electrically conductive materials described herein regarding the anode electrode 102. Although depicted as including a single layer, the patterned conductive layer 172 can include two more layers of conductive material. The patterned conductive layer 172 can be formed using any suitable technique or techniques, e.g., chemical etching, photolithography, dry etching, etc.

The patterned conductive layer 172 can be electrically connected to the cathode electrode layer 174 using any suitable technique or techniques. In one or more embodiments, the patterned conductive layer 172 can be disposed directly onto one or more portions of the cathode electrode layer 174 such that the patterned conductive layer is electrically connected to these portions of the cathode electrode layer. In one or more embodiments, one or more dielectric layers can be disposed between the cathode electrode layer 174 and the patterned conductive layer 172 such that the patterned conductive layer is electrically isolated from the cathode electrode layer. One or more vias can be formed through the dielectric layer such that the patterned conductive layer 172 is electrically connected to the cathode electrode layer 174.

The patterned conductive layer 172 can also be electrically connected to one or more of the vias 178 using any suitable technique or techniques. In one or more embodiments, the patterned conductive layer 172 can be disposed such that it is in contact with one or more vias 178. In one or more embodiments, the cathode electrode layer 174 may be disposed between the patterned conductive layer 172 and the one or more vias 178.

Figure 3:
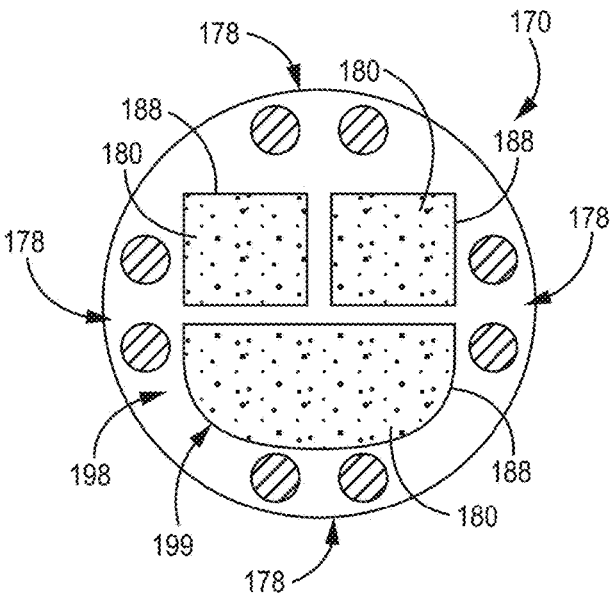
FIG. 3 is a schematic top cross-section view of the electrical component of FIG. 3.

FIG. 3 is a schematic top cross-section view of the electrical component 170. As shown in FIG. 3, the tantalum material 180 can be disposed in one or more openings 188 of differing cross-sectional shapes and dimensions. Further, the openings 188 can be disposed in any suitable pattern or configuration within the substrate 176. As shown in FIG. 3, the openings 188 are disposed in a central portion 199 of the substrate 176. The shape and size of the openings 188 and thus the tantalum material 180 disposed within such openings can be customized based on device design constraints. Further, the vias 178 can be disposed in any suitable locations in the substrate 176. In the embodiment illustrated in FIG. 3, the vias 178 are disposed in an outer portion 198 of the substrate 176. In one or more embodiments, one or more vias 178 can be disposed in the central portion 199 of the substrate such that these vias are disposed between one or more openings 188.

Figure 4:
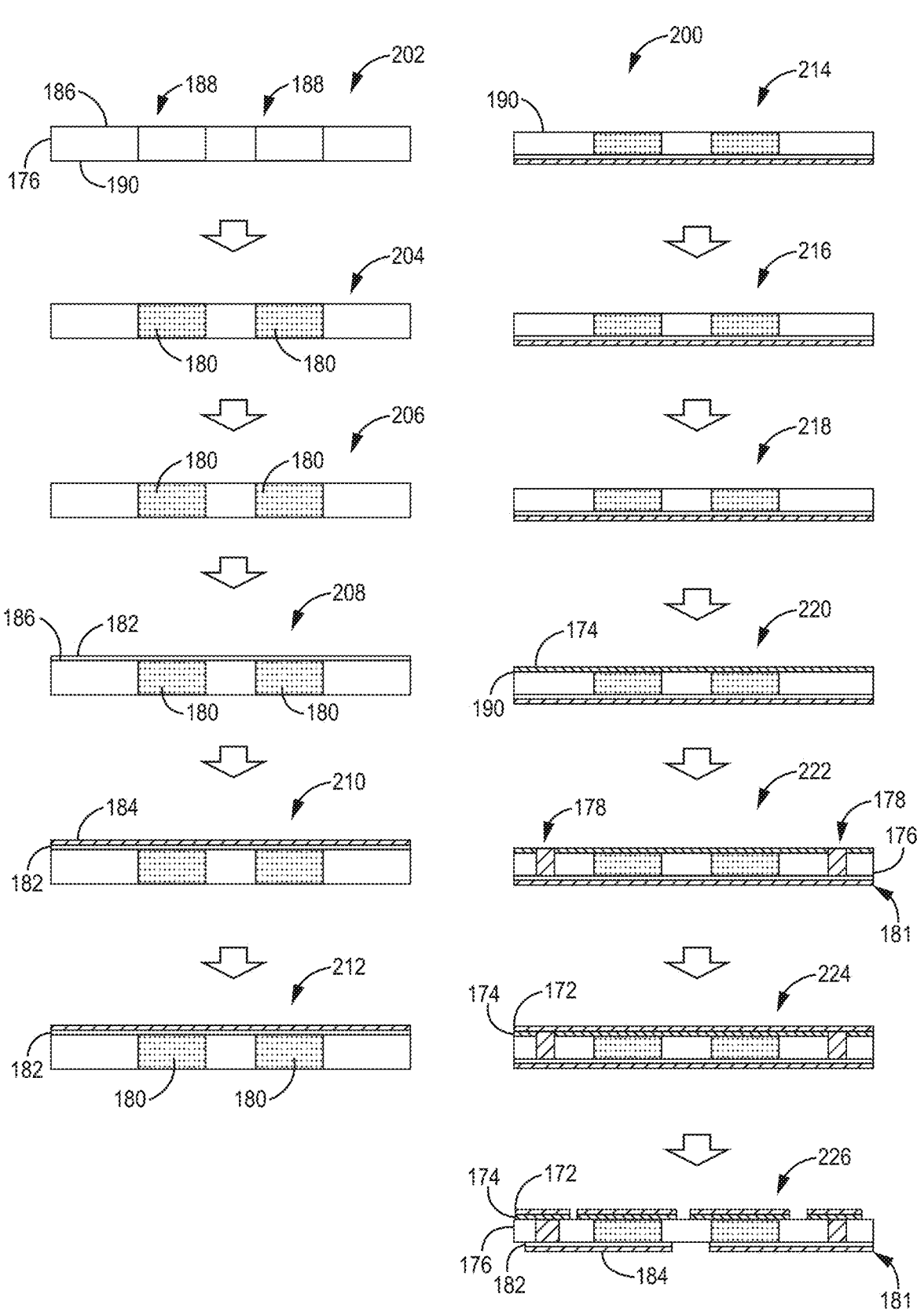
FIG. 4 is a schematic flow diagram of a process for forming the electrical component of FIG. 2.

The electrical components 100, 170 can be manufactured utilizing any suitable technique or techniques. For example, FIG. 4 is a schematic flow diagram of one embodiment of a method 200 of forming the electrical component 170. Although described in reference to electrical component 170 of FIGS. 2-3, the method 200 can be utilized to form any suitable electrical component, e.g., electrical component 100 of FIG. 1.

At 202, one or more openings 188 can be disposed in the first major surface 186 of the substrate 176 using any suitable technique or techniques. In one or more embodiments, the openings 188 extend between the first major surface 186 and the second major surface 190 of the substrate 176. The tantalum material 180 can be disposed into the openings 188 of the substrate 176 using any suitable technique or techniques at 204. In one or more embodiments, the tantalum material 180 can be dried and debindered using any suitable technique or techniques at 206. In one or more embodiments, the tantalum material 180 can be dried by heating the material to a temperature of at least 80 degrees Celsius and no greater than 200 degrees Celsius. Further, the tantalum material 180 can be debindered by heating the tantalum material 180 to a temperature of at least 200 degrees Celsius and no greater than 500 degrees Celsius.

At 208, the tantalum layer 182 can be disposed on the first major surface 186 of the substrate 176 and over the openings 188 using any suitable technique or techniques, e.g., deposition, PVD, CVD, sputtering, electroplating, foil lamination, etc. At 210, the conductor layer 184 is disposed on the tantalum layer 182 using any suitable technique or techniques. In one or more embodiments, the tantalum material 180 can be sintered at 212 using any suitable technique or techniques. Sintering tantalum material 180 can cause the tantalum particles 192 to at least partially fuse together to form one or more mechanical and electrical connections between the tantalum particles. Additionally, sintering can cause one or more of the tantalum particles 192 to fuse to the tantalum layer 182, forming at least one mechanical and electrical connection between the tantalum material 180 and the tantalum layer. In one or more embodiments, the tantalum material 180 can be sintered by heating the material to a temperature of at least 1200 degrees Celsius and no greater than 3000 degrees Celsius.

At 214, the second major surface 190 of the substrate 176 is planarized using any suitable technique or techniques, e.g., grinding, polishing, laser ablation, etc. At 216, the dielectric layer 194 (FIG. 2) can be disposed on a surface of one or more tantalum particles 192 using any suitable technique or techniques. In one or more embodiments, the dielectric layer 194 can be disposed by oxidizing one or more of the tantalum particles 192. At 218, the electrolyte cathode layer 196 (FIG. 2) can be disposed on the dielectric layer 194 using any suitable technique or techniques.

At 220, the cathode electrode layer 174 can be disposed on the second major surface 190 of the substrate 176 using any suitable technique or techniques. In one or more embodiments, the cathode electrode layer 174 can be formed by disposing a cathode connection layer (e.g., cathode connection layer 110) on the second major surface 190 and over openings 188 of the substrate 176. A conductor layer (conductor layer 108 of FIG. 1) can be disposed on the cathode connection layer to form the cathode electrode layer 174 (or cathode electrode 106).

At 222, the vias 178 are disposed in the substrate 176 through the cathode electrode layer 174 using any suitable technique or techniques. In one or more embodiments, the vias 178 can extend between the first major surface 186 and the second major surface 190 to the anode electrode layer 181. At 224, the patterned conductive layer 172 is disposed on one or more portions of the cathode electrode layer 174 using any suitable technique or techniques. In one or more embodiments, the patterned conductive layer 172 can be electrically connected to one or more of the vias 178 using any suitable technique or techniques. In one or more embodiments, the vias 178 may be optionally disposed in the substrate prior to one or more openings 188 being disposed in the substrate at 202.

At 226, portions of at least one of the patterned conductive layer 172, the cathode electrode layer 174, the cathode electrode layer (e.g., the tantalum layer 182 and the conductor layer 184), or the substrate 176 can be removed using any suitable technique or techniques, e.g., laser ablation, chemical etching, dry etching, etc.

Figure 5:
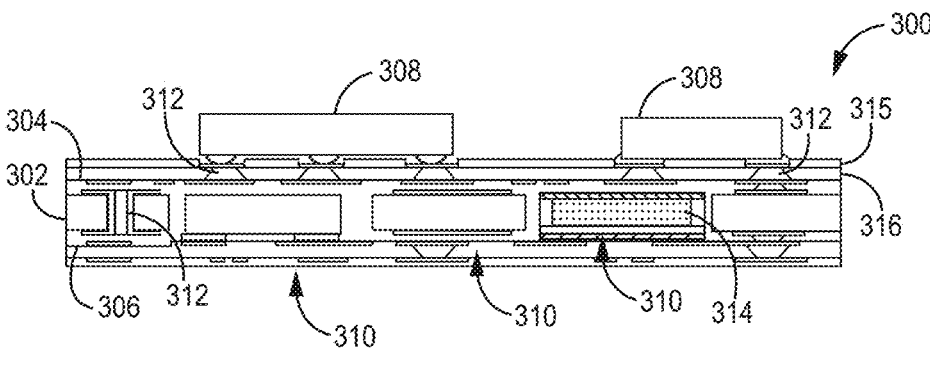
FIG. 5 is a schematic cross-section view of an integrated circuit package.

As mentioned herein, the various embodiments of electrical components can be utilized in any suitable device or electronic circuitry. For example, FIG. 5 is a schematic cross-section view of one embodiment of an integrated circuit package 300. The package 300 includes a substrate 302 that has a first major surface 304 and a second major surface 306. Disposed on the first major surface 304 of the substrate 302 are devices 308. In one or more embodiments, additional layers, such as layers 315 and 316 may be disposed on at least one of the first major surface 304 or the second major surface 306. The devices 308 may be disposed on the first major surface 308 or a surface of one of the additional layers 315 and 316. The package 300 can also include one or more embedded devices 310 disposed at least partially within the substrate 302. The one or more embedded devices 310 can be electrically connected to one or more embedded devices and one or more of the devices 308 disposed on at least one of the first and second major surfaces 304, 306 using one or more conductive vias 312 or vertical interconnections disposed on or within the substrate or one or more redistribution layers disposed on or within the substrate.

The devices 308 can include any suitable devices or components, e.g., an accelerometer, crystal, connector, resistor, transformer, antenna, sensor, etc. In one or more embodiments, one or more devices 308 can be disposed on the second major surface 306 of the substrate 302. Further, in one or more embodiments, one or more devices 308 can be disposed on each of the first and second major surfaces 304, 306 of the package 300. Although depicted as including two devices 308, the package 300 can include any suitable number of devices.

Further, the embedded devices 310 can include any suitable devices or components (e.g., the same devices or components described herein regarding devices 308). In one or more embodiments, the embedded devices 310 can include an electrical component 314. The electrical component 314 can include any suitable electrical component, e.g., electrical component 100 of FIG. 1. In one or more embodiments, the electrical component 314 can include an embeddable tantalum capacitor.

Figure 6:
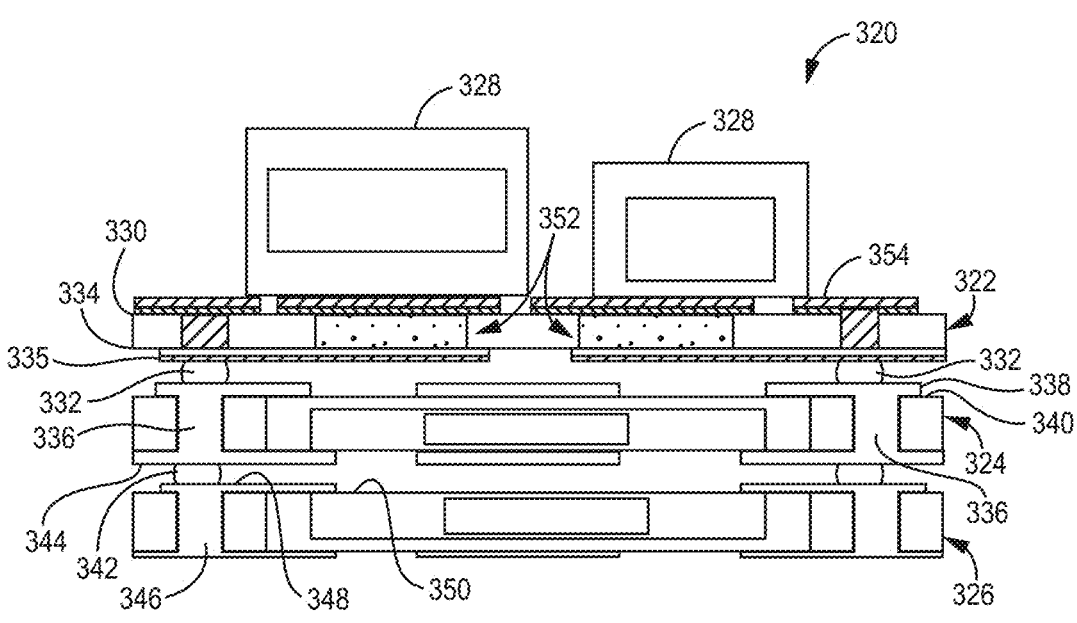
FIG. 6 is a schematic cross-section view of an electronic assembly.

FIG. 6 is a schematic cross-section view of an electronic assembly 320. The assembly 320 includes an electrical component 322, a first circuit package 324, and a second circuit package 326. Further, the assembly 320 includes devices 328 disposed on a first major surface 330 of the electrical component 322. The electrical component 322, the first circuit package 324, and the second circuit package 326 can be electrically connected using any suitable technique or techniques. In the embodiment illustrated in FIG. 6, the electrical component 322 includes conductive pads 332 disposed on a second major surface 334 or anode electrode 335 of the electrical component that are electrically connected to conductive vias 336 disposed in the first circuit package 324. The conductive pads 332 of the electrical component 322 can be electrically connected to a patterned conductive layer 338 disposed on a first major surface 340 of the first circuit package 324, where the patterned conductive layer is electrically connected to the conductive vias 336. Further, the first circuit package 324 can be electrically connected to the second circuit package 326 by conductive pads 342 disposed on a second major surface 344 of the first circuit package that are electrically connected to conductive vias 346 disposed in the second circuit package. In one or more embodiments, the conductive pads 342 of the first circuit package 324 are electrically connected to a patterned conductive layer 348 disposed on a major surface 350 of the second circuit package 326, where the patterned conductive layer is electrically connected to the conductive vias.

The electrical component 322 can include any suitable electrical component, e.g., the electrical component 170 of FIGS. 2-3. In one or more embodiments, the electrical component 322 can include one or more embedded devices 352 as described herein regarding electrical component 170 and electrical component 100. The embedded devices 352 may be tantalum capacitors. The electrical component 322 can act as an interposer between the devices 328 and the first circuit package 324. The electrical component 322 allows embedded devices 352 to be used in electronic assembly 320 while maintaining a thinner profile. In one or more embodiments, the electrical component 322 can have a thickness in a direction orthogonal to its first and second major surfaces 330, 334 of at least 50 μm and no greater than 500 μm. This can allow the size of electronic assembly 320 to be smaller than typical assemblies that include typical surface mounted tantalum capacitors. The thin size of electronic device 322 makes it particularly useful in devices that require small profiles, such as in implantable devices.

The electronic devices 328 can include any suitable electronic device or component, e.g., the same electronic devices described herein regarding electronic devices 308 of integrated circuit package 300 of FIG. 6. These electronic devices 328 can be electrically connected to one or more of the embedded devices 352 using any suitable technique or techniques. In one or more embodiments, the electronic devices 328 can be electrically connected to a patterned conductive layer 354 disposed on the first major surface 330 of the electrical component 322.

The first and second circuit packages 324, 326 that are electrically connected to each other and the electrical component 322 can include any suitable circuit packages. In one or more embodiments, the first and second circuit packages 324, 326 each include one or more logic modules, sensor modules, analog modules, memory modules, integrated passive modules, MEMS modules, etc.

Figure 7:
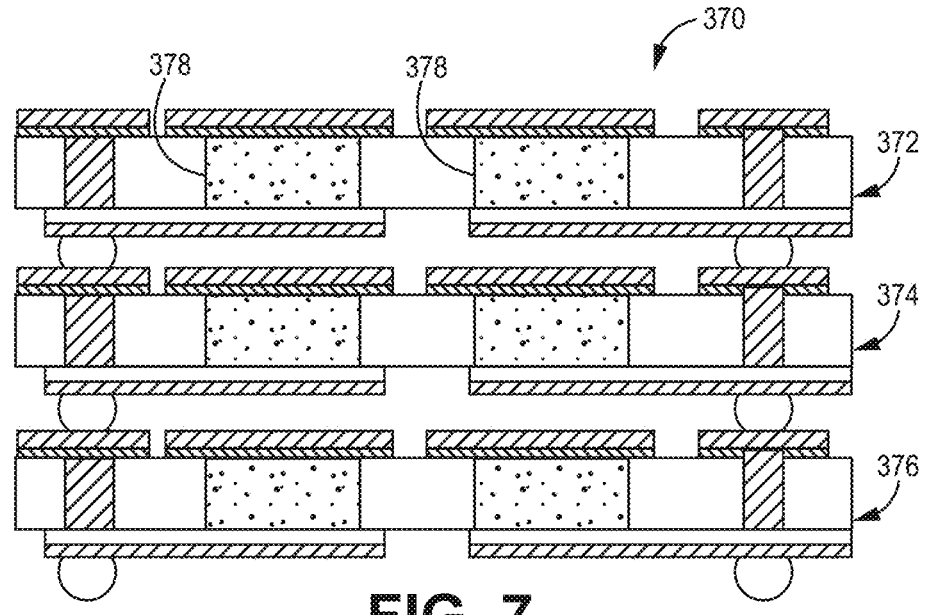
FIG. 7 is a schematic cross-section view of a stacked substrate assembly.

FIG. 7 is a schematic cross-section view of a stacked substrate package 370 that includes a first electrical component 372, a second electrical component 374, and a third electrical component 376. The first, second, and third electrical components 372, 374, 376 can be electrically connected to each other using any suitable technique or techniques. Although depicted as including three electrical components, 372, 374, 376, the stacked substrate package 370 can include any suitable number of electrical components, the stacked substrate package 370 can be utilized in any suitable device or package and include other devices or components electrically connected to one or more of the electrical components 372, 374, 376 using any suitable technique or techniques.

Each of the electrical components 372, 374, 376 can include any suitable electrical component, e.g., electrical component 170 of FIGS. 2-3. Further, one or more of the electrical components 372, 374, 376 can include one or more embedded tantalum capacitors 378 as described herein regarding electrical component 100 of FIG. 1 and electrical component 170 of FIGS. 2-3. In one or more embodiments, stacking electrical components 372, 374, 376 can provide a higher amount of capacitance in a smaller profile than can be provided by a group of typical surface-mounted tantalum capacitors.

It should be understood that various aspects disclosed herein can be combined in different combinations than the combinations specifically presented in the description and accompanying drawings. It should also be understood that, depending on the example, certain acts or events of any of the processes or methods described herein can be performed in a different sequence, can be added, merged, or left out altogether (e.g., all described acts or events can not be necessary to carry out the techniques). In addition, while certain aspects of this disclosure are described as being performed by a single module or unit for purposes of clarity, it should be understood that the techniques of this disclosure can be performed by a combination of units or modules associated with, for example, a medical device.

In one or more examples, the described techniques can be implemented in hardware, software, firmware, or any combination thereof. If implemented in software, the functions can be stored as one or more instructions or code on a computer-readable medium and executed by a hardware-based processing unit. Computer-readable media can include computer-readable storage media, which corresponds to a tangible medium such as data storage media (e.g., RAM, ROM, EEPROM, flash memory, or any other medium that can be used to store desired program code in the form of instructions or data structures and that can be accessed by a computer).

Instructions can be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor" as used herein can refer to any of the foregoing structure or any other physical structure suitable for implementation of the described techniques. Also, the techniques could be fully implemented in one or more circuits or logic elements.

All references and publications cited herein are expressly incorporated herein by reference in their entirety into this disclosure, except to the extent they may directly contradict this disclosure. Illustrative embodiments of this disclosure are discussed, and reference has been made to possible variations within the scope of this disclosure. These and other variations and modifications in the disclosure will be apparent to those skilled in the art without departing from the scope of the disclosure, and it should be understood that this disclosure is not limited to the illustrative embodiments set forth herein. Accordingly, the disclosure is to be limited only by the claims provided below.

What is claimed is:

1. An electrical component comprising:
    a substrate comprising:
        a first major surface;
        a second major surface;
        an opening disposed in the substrate and extending between the first major surface and the second major surface; and
        a conductive via that extends between the first major surface and the second major surface of the substrate;
    tantalum material disposed within the opening and comprising tantalum particles;
    an anode electrode disposed on the first major surface of the substrate and over the opening; and
    a cathode electrode disposed on the second major surface of the substrate and over the opening.

2. The electrical component of claim 1, wherein the anode electrode comprises:
    a tantalum layer disposed on the first major surface of the substrate and over the opening; and
    a conductor layer disposed on the tantalum layer.

3. The electrical component of claim 1, wherein the tantalum material further comprises:
    a dielectric layer disposed on a surface of one or more of the tantalum particles; and
    an electrolyte cathode layer disposed on the dielectric layer.

4. The electrical component of claim 1, wherein the cathode electrode comprises:
    a cathode connection layer disposed on the second major surface of the substrate and over the opening; and
    a conductor layer disposed on the cathode connection layer.

5. The electrical component of claim 1, wherein the substrate further comprises
    a conductor layer disposed on the cathode electrode and electrically connected to the conductive via.

6. The electrical component of claim 1, wherein the tantalum particles are sintered together.

7. The electrical component of claim 1, wherein the substrate comprises sapphire.

8. The electrical component of claim 1, wherein the substrate comprises ceramic material.

9. The electrical component of claim 1, wherein the substrate further comprises vertical interconnections.

10. The electrical component of claim 1, wherein the electrical component comprises at least 90% tantalum material by volume.

11. An integrated circuit package comprising the electrical component of claim 1.

12. A method comprising:

disposing an opening in a substrate such that the opening extends between a first major surface and a second major surface of the substrate;

disposing tantalum material into the opening of the substrate;

disposing an anode electrode on the first major surface of the substrate and over the opening;

disposing a cathode electrode on the second major surface of the substrate and over the opening; and disposing a via in the substrate through the cathode electrode such that the via extends between the first major surface and the second major surface of the substrate to the anode electrode.

13. The method of claim 12, wherein:

disposing the tantalum material into the opening of the substrate comprises printing the tantalum material into the opening of the substrate, wherein the method further comprises:

drying the tantalum material;

debindering the dried tantalum material; and sintering the debindered tantalum material.

14. The method of claim 13, wherein drying the tantalum material comprises heating the tantalum material to a temperature of at least 80 degrees Celsius.

15. The method of claim 13, wherein debindering the tantalum material comprises heating the tantalum material to a temperature of at least 200 degrees Celsius.

16. The method of claim 13, wherein sintering the tantalum material comprises heating the tantalum material to at least 1200 degrees Celsius.

17. The method of claim 12, wherein disposing the anode electrode comprises:

disposing a tantalum layer on the first major surface of the substrate and over the opening; and disposing a conductor layer on the tantalum layer.

18. The method of claim 12, further comprising planarizing the second major surface of the substrate prior to disposing the cathode electrode on the second major surface.

19. The method of claim 12, wherein disposing the cathode electrode comprises:

disposing a cathode connection layer on the second major surface of the substrate; and disposing a conductor layer on the cathode connection layer.

20. The method of claim 12, further comprising:

disposing a dielectric layer on a surface of one or more tantalum particles of the tantalum material; and disposing an electrolyte cathode layer on the dielectric layer.

* * * * *